(12) United States Patent  
Gemmeke et al.

(10) Patent No.: US 7,996,738 B2
(45) Date of Patent: Aug. 9, 2011

(54) SEMICONDUCTOR CHIP WITH A PLURALITY OF SCANNABLE STORAGE ELEMENTS AND A METHOD FOR SCANNING STORAGE ELEMENTS ON A SEMICONDUCTOR CHIP

(75) Inventors: Tobias Gemmeke, Stutensee (DE); Christoph Jaeschke, Tuebingen (DE); Jens Kuenzer, Boeblingen (DE); Cedric Lichtenau, Stuttgart (DE); Thomas Pflueger, Leinfelden (DE); Jochen Preiss, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/042,944

(22) Filed: Mar. 5, 2008

(65) Prior Publication Data

US 2008/0276140 A1 Nov. 6, 2008

(51) Int. Cl.
 *G01R 31/28* (2006.01)
(52) U.S. Cl. ........................................ 714/726
(58) Field of Classification Search .................... 714/726
 See application file for complete search history.

(56) References Cited

U.S. PATENT DOCUMENTS

| | | | | |
|---|---|---|---|---|
| 7,165,006 | B2 * | 1/2007 | Dhong et al. | 702/120 |
| 7,269,780 | B2 * | 9/2007 | Arima et al. | 714/764 |
| 7,346,820 | B2 * | 3/2008 | Padhye et al. | 714/726 |
| 7,406,639 | B2 * | 7/2008 | Clark | 714/726 |
| 7,469,372 | B2 * | 12/2008 | Nardini et al. | 714/726 |
| 7,580,807 | B2 * | 8/2009 | Bullock et al. | 702/117 |
| 2005/0010832 | A1 * | 1/2005 | Caswell et al. | 713/330 |
| 2009/0019329 | A1 * | 1/2009 | Aitken et al. | 714/729 |

\* cited by examiner

Primary Examiner — James C Kerveros
(74) Attorney, Agent, or Firm — Michael J. LeStrange

(57) ABSTRACT

A semiconductor chip subdivided into power domains, at least one of the power domains is separately activated or deactivated and at least a part of the scannable storage elements are interconnected to one or more scan chains. At least one scan chain is serially subdivided into scan chain portions and the scan chain portion is arranged within one of the power domains. For at least one scan chain portion a bypass line is provided for passing by scan data and at least one select unit is provided for selecting between the bypass line and the corresponding scan chain portion in dependence of the activated or deactivated state of the corresponding power domains.

20 Claims, 6 Drawing Sheets

SEMICONDUCTOR CHIP WITH A PLURALITY OF SCANNABLE STORAGE ELEMENTS AND A METHOD FOR SCANNING STORAGE ELEMENTS ON A SEMICONDUCTOR CHIP

FIELD OF THE INVENTION

The present invention relates to a semiconductor chip with a plurality of scannable storage elements. Further the present invention relates to a method for scanning the storage elements on said semiconductor chip for testing purposes.

BACKGROUND OF THE INVENTION

Modern semiconductor chips, especially processor chips comprise a plurality of electronic elements and are therefore faced with very high power consumption. Therefore it is necessary to reduce the power consumption of such semiconductor chips. A method according to the state of the art uses separate power domains to subdivide the semiconductor chip. Each power domain has a separate power supply or some way to turn off its local power. As many transistors as possible may be switched off, or their voltages may by reduced.

For testing purposes of the chip all or part of the storage elements of each power domain are interconnected to a so-called scan chain. Each scannable storage element comprises a scan input and a scan output. The scan chain includes a plurality of connections between the scan output of one storage element and the scan input of the next storage element. The scan chain is a serial line moving a data bit into each storage element according to a predetermined pattern scheme. In test mode said scan chain has the functionality of a shift register.

If such a power domain is switched off or the circuit's voltage is reduced, then a scanning process is not possible on said power domain, since the logic inside the power domain is not functional. Hence the whole scan chain is interrupted. It is not possible anymore to scan the storage elements on the active power domains of the semiconductor chip.

In the state of the art a solution of this problem is to activate all those power domains with the storage elements to be scanned. However, this results in a huge power consumption peek that may not be supported currently by the system. The activation of all power domains to be able to scan would further take a relatively long time. This method is already used during bring-up, where few cooling constraints are present and no power reduction techniques need to be applied, that impacts the functionality of the scan chain.

A further solution in the state of the art is to subdivide each scan chain into independent scan chain portions at each power domain. This requires additional numbers of wires running from and to the scan engine. The complexity of the scan structure and its verification is increased. If there is only one storage element in the wrong domain, then the scan chain is interrupted. In the worst case the configuration chain for the power controller is interrupted, preventing the ability to activate the power domain with the badly wired storage element. This would require a change to the chip masks and a remanufacturing of the semiconductor chip. Further the user has to activate the power domain to be scanned before and adding again more overhead in the software.

FIG. 6 illustrates a schematic diagram of an example of a semiconductor chip according to the prior art. Said semiconductor chip is subdivided into a plurality of power domains 10, 12 and 14. The power domains 10, 12 and 14 may be separately activated and deactivated by a power controller 16 via signal lines 18, 20 and 22. In FIG. 6 all power domains 10, 12 and 14 are activated. The power domains 10, 12 and 14 include a plurality of circuit units 24, 26 and 28. In FIG. 6 three circuit units 24, 26 and 28 are shown in each power domain 10, 12 and 14. Each circuit unit 24, 26 and 28 comprises a plurality of electronic elements and in particular at least one scannable storage element.

FIG. 7 illustrates a schematic diagram that of a semiconductor chip according to the prior art of FIG. 6 in a state, wherein the second power domain 12 is deactivated. Therefore the scan chains 42, 44 and 46 are interrupted in the second power domain 12, since the each of the scan chains 42, 44 and 46 crosses the deactivated power domain 32. In this second state it is not possible to make the scan test. If only one of the power domains 10, 12 and 14 is deactivated, then it is not possible to scan the storage elements.

SUMMARY OF THE INVENTION

It is an object of the present invention to provide a scannable semiconductor chip with a plurality of storage elements and a method for scanning the storage elements on said semiconductor chip, wherein a part of the semiconductor chip is deactivated.

The above object is achieved by a method as laid out in the independent claims. Further advantageous embodiments of the present invention are described in the dependent claims and are taught in the description below.

The core idea of the invention is to subdivide the semiconductor chip into power domains and to subdivide the scan chain into scan chain portions. The power domains are separately activated or deactivated. Each scan chain portion corresponds with at least one power domain.

Further a bypass line for each scan chain portion is provided. It is automatically recognized, if the scan chain portion is on a deactivated power domain. In this case said scan chain portion is bypassed via the corresponding bypass line. The present invention guarantees always closed scan chains.

A scan engine is arranged on the semiconductor chip for sending the scan data to the scan chain and receiving the scan data from the scan chain. The scan engine is provided for scanning a plurality of parallel scan chains.

A characterizing logical bit is inserted into the scan chain by a power indicator. Said logical bit indicates that the scan data arises from activated or deactivated power domain. The power indicator is arranged on such a part of the semiconductor chip, which is permanently activated.

During test the semiconductor chip may remain within normal operating conditions. A complicated scan domain partitioning is not necessary. A complex chain selection is also not necessary. All the scanned data are real well known data and there is no random data from depowered part of the semiconductor chip. It is not necessary to switch on all or a large part of the power domains. The invention may be realized with low cost.

BRIEF DESCRIPTION OF THE DRAWINGS

The above as well as additional objectives, features and advantages of the present invention become apparent in the following detailed written description.

The novel and inventive features believed to the characteristics of the invention are set forth in the appended claims. The invention itself and its advantages are best understood by reference to the following detailed description of preferred embodiments in conjunction with the accompanied drawings, wherein:

DETAILED DESCRIPTION OF THE INVENTION

Figure 1:
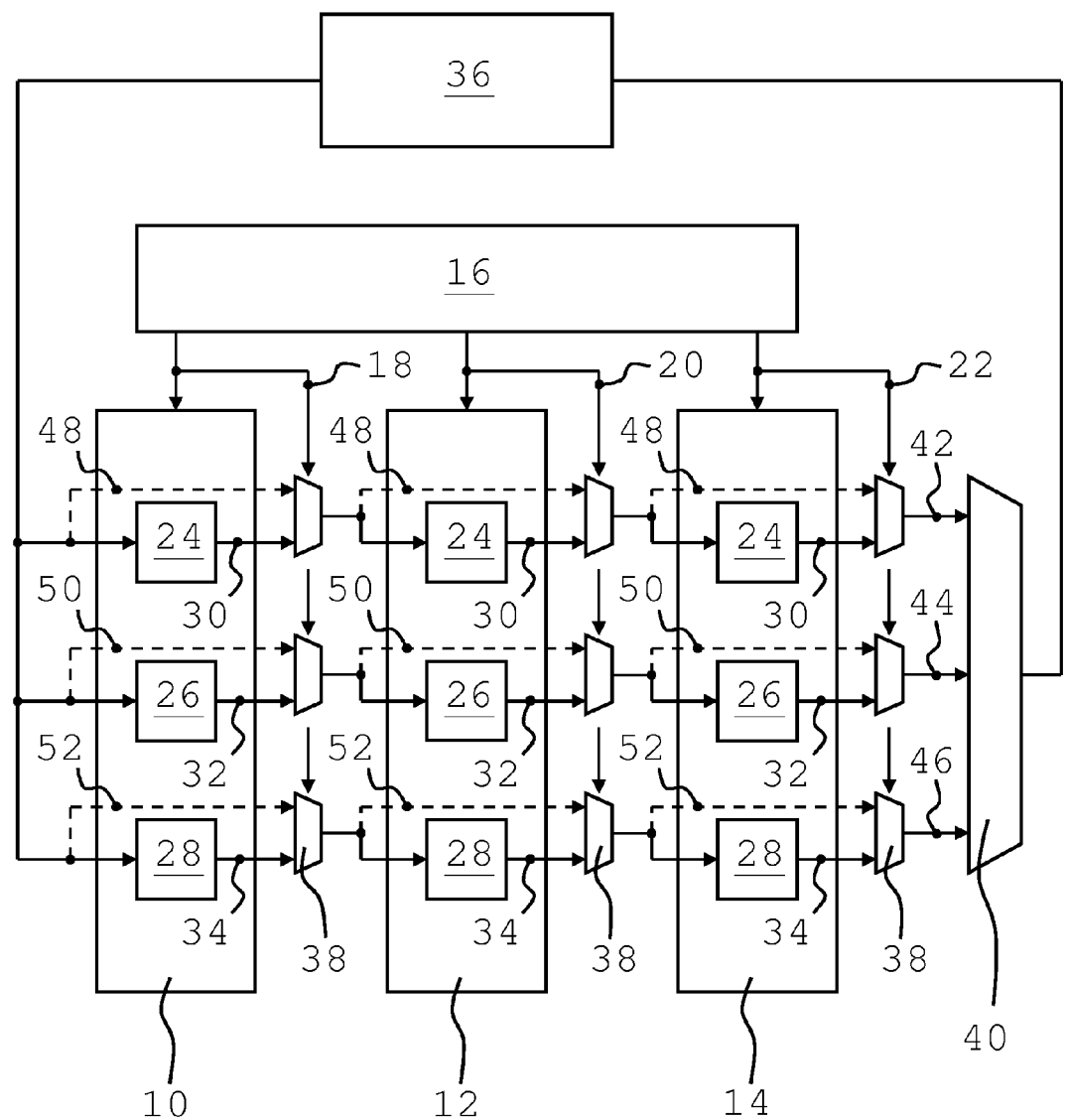
FIG. 1 illustrates a schematic diagram of a semiconductor chip according to a first embodiment of the present invention.

FIG. 1 illustrates a schematic diagram of a semiconductor chip according to a preferred embodiment of the present invention. The semiconductor chip is subdivided into a plurality of power domains 10, 12 and 14. In FIG. 1 a first power domain 10, a second power domain 12 and a third power domain 14 are shown. The power domains 10, 12 and 14 may be separately activated and deactivated by a power controller 16 via signal lines 18, 20 and 22. The first power domain 10 is controlled via a first signal line 18. The second power domain 12 is controlled via a second signal line 20, and the third power domain 14 is controlled via a third signal line 22.

The power domains 10, 12 and 16 include a plurality of circuit units 24, 26 and 28. In FIG. 1 a first circuit unit 24, a second circuit unit 26 and a third circuit unit 28 are shown in each power domain 10, 12 and 14, respectively. These circuits may or may not be identical. The circuit units 24, 26 and 28 comprise a plurality of electronic elements. In particular, each circuit unit 24, 26 and 28 comprises at least one scannable storage element. The scannable storage element includes a scan input and a scan output. Via this scan input and scan output the scannable storage elements are serially connected to a scan chain. The scan chain is a serial line moving a data bit into each scannable storage element according to a predetermined pattern scheme. The scan chain may be used but it is not limited to testing purposes or initialization and has the functionality of a shift register in a test mode. There may be also circuit units without any scannable storage elements.

The scannable storage elements within one circuit unit 24, 26 and 28 are serially interconnected and form a scan chain portion 30, 32 and 34, respectively. A first scan chain portion 30 corresponds with the first circuit unit 24, and a second scan chain portion 32 corresponds with the second circuit unit 26. In the same way a third scan chain portion 34 corresponds with the third circuit unit 28. The inputs of said scan chain portions 30, 32 and 34 in the first power domain 10 are connected to the output of a scan engine 36. For each scan chain portion 30, 32 and 34 a multiplexer element 38 is provided. The multiplexer element 38 is a two-to-one multiplexer. The outputs of the scan chain portion 30, 32 and 34 are connected to a first input of the corresponding multiplexer element 38.

The outputs of the multiplexer elements 38 corresponding to the first power domain 10 are connected to the inputs of the scan chain portions 30, 32 and 34, respectively, of the second power domain 12. In the same way the outputs of the multiplexer elements 38 corresponding to the second power domain 12 are connected to the inputs of the scan chain portions 30, 32 and 34, respectively, of the second power domain 12. Additionally, the outputs of the multiplexer elements 38 corresponding to the third power domain 14 are connected to the inputs of a main multiplexer 40. In this embodiment the main multiplexer 40 is a three-to-one multiplexer. The multiplexer elements 38 are located between two neighbor power domains 10, 12 and 14. The multiplexer elements 38 are located within a standby domain, which is permanently powered.

In this way one scan chain portions 30, 32 and 34 of each power domain 10, 12 and 14 are serially interconnected to a scan chain 42, 44 and 46, respectively. The first scan chain portions 30 with their corresponding multiplexer elements 38 form a first scan chain 42. In the same way the second scan chain portions 32 with their corresponding multiplexer elements 38 form a second scan chain 44. At last third scan chain portions 34 with their corresponding multiplexer elements 38 form a third scan chain 46. The inputs of the scan chains 42, 44 and 46 are connected to the output of the scan engine 36. The outputs of the scan chains 42, 44 and 46 are connected to the inputs of the main multiplexer 40. The output of the main multiplexer 40 is connected to the input of the scan engine 36. The scan engine 36 sends scan data to the inputs of the scan chains 42, 44 and 46 and receives scan data from the output of the main multiplexer 40.

For each scan chain portion 30, 32 and 34 a bypass line 48, 50 and 52 is provided. A first bypass line 48 corresponds with the first scan chain portion 30. In the same way a second bypass line 50 corresponds with the second scan chain portion 32. At last a third bypass line 52 corresponds with the third scan chain portion 34. Via said bypass line 48, 50 and 52 the input of the scan chain portion 30, 32 and 34 is connected to a second input of the corresponding multiplexer element 38.

A select input of the multiplexer element 38 is connected to the signal line 18, 20 and 22 of the corresponding power domain 10, 12 and 14, respectively. When a power domain 10, 12 and 14 is deactivated by the power controller 16, the multiplexer element 38 will bypass the scan content of the corresponding circuit unit 24, 26 and 28 and hence guarantee a closed scan chain 42, 44 and 46. The test procedure may be performed, if one or more of the power domains 10, 12 and 14 are deactivated.

Figure 2:
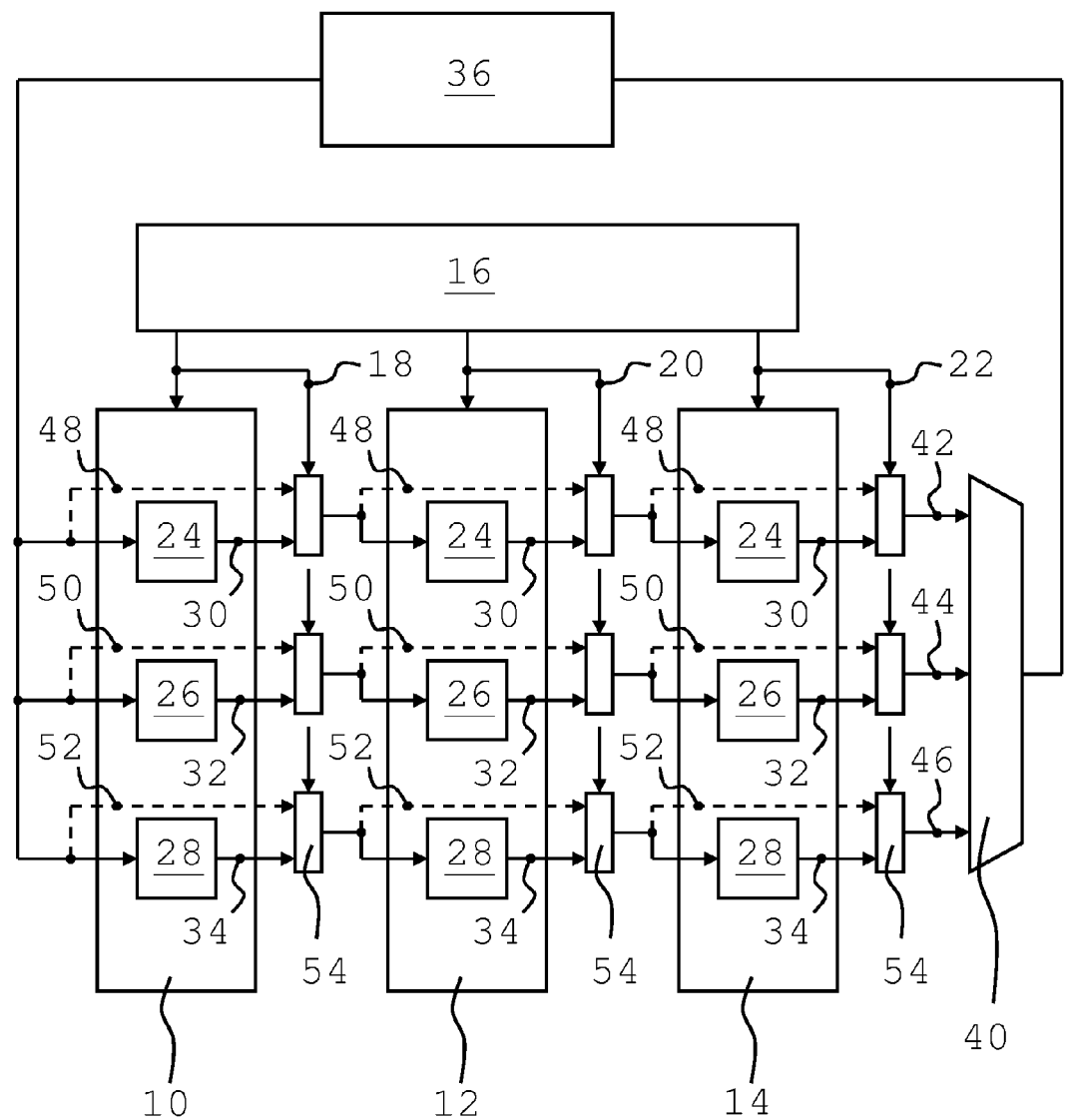
FIG. 2 illustrates a schematic diagram of a semiconductor chip according to a second embodiment of the present invention.

FIG. 2 illustrates a schematic diagram of a semiconductor chip according to a second embodiment of the present invention. The semiconductor chip according to the second embodiment has substantially the same components as the semiconductor chip according to the first embodiment in FIG. 1.

Instead of the multiplexer element 38 in the first embodiment the semiconductor chip according to the second embodiment includes power indicators 54. Like the multiplexer elements 38 the power indicators 54 have two inputs, one select input and one output. The power indicators 54 are interconnected in the same way as the multiplexer elements 38. The power indicators 54 are also located between two neighbor power domains 10, 12 and 14. The power indicators 54 are located within the standby domain, which is permanently activated.

When a power domain 10, 12 and 14 is deactivated by the power controller 16, the corresponding signal on signal line 18, 20 or 22, respectively, acts on the select input of the power indicator 54, so that the multiplexer element 38 will bypass the scan content of that circuit unit 24, 28 and 30. Hence, the closed scan chain 42, 44 and 46 is guaranteed.

The scan engine 40 is used to scan the scan chain portions with all storage elements or a part of the power domains 10, 12 and 14. The power controller 16 controls the states of the power domains 10, 12 and 14. The power domain 10, 12 and 14 may be either in the state "on" or in the state "off".

The select input of the power indicator 54 is sourced by the power controller 16 with the same signal that is controlling the power of the power domains. If the power of the power domain 12 is switched off, then the bypass lines 48, 50 and 52 around the power domain 12 are selected. If the power domain is activated, then the power indicator will insert a logical zero before the scan data into the scan-chains. If the power domain is deactivated and bypassed, then the power indicator will insert a logical one into the scan-chain.

Figure 3:
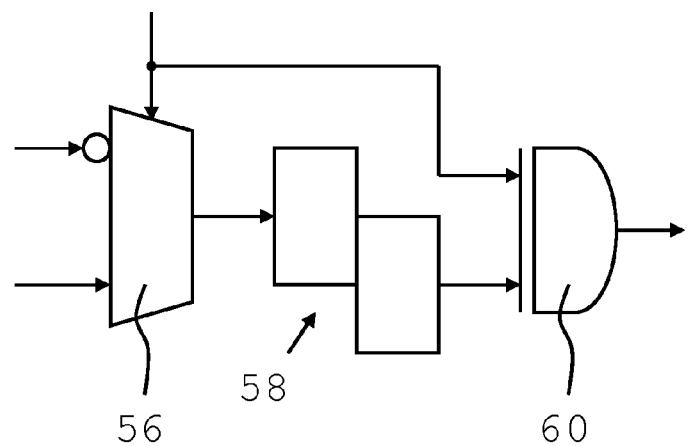
FIG. 3 illustrates a detailed diagram of a power indicator in the semiconductor chip according to the second embodiment of the present invention.

In FIG. 3 a detailed diagram of the power indicator 54 of FIG. 2 is shown. The power indicator 54 includes an internal multiplexer 56, a flip-flop element 58 and a XOR gate 60. The internal multiplexer 56 comprises a positive and a negated input. The internal multiplexer 56 is a two-to-one multiplexer. The inputs of the internal multiplexer 56 are identical with the inputs of the power indicator 54.

The output of the internal multiplexer 56 is connected to the input of the flip-flop element 58. The select input of the power indicator 54 is connected to the select input of the internal multiplexer 56 and to a first input of the XOR gate 60. The output of the internal multiplexer 56 is connected to a second input of the XOR gate 60. The output of the XOR gate 60 is identical with the output of the power indicator 54.

Figure 4:
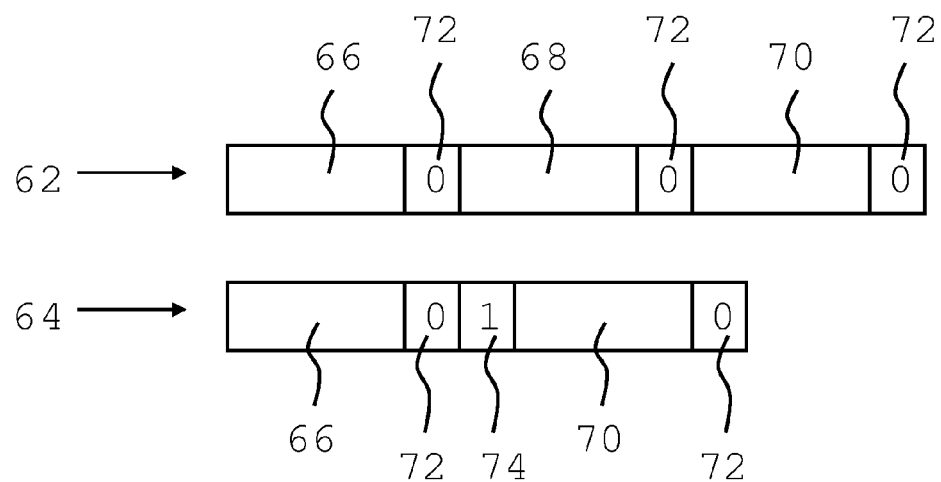
FIG. 4 illustrates a schematic diagram of two bit-patterns of the scan chain according to the second embodiment of the present invention.

FIG. 4 illustrates two schematic bit-patterns 62 and 64 of the scan chain according to the second embodiment of the present invention. A first bit-pattern 62 corresponds with a first state, wherein all three power domains 10, 12 and 14 are activated. A second bit-pattern 64 corresponds with a second state, wherein the power domains 10 and 14 are activated and the power domain 12 is deactivated.

The first bit-pattern 62 includes serially scan data of the first power domain 66, scan data of the second power domain 68 and scan data of the third power domain 70. Notice that scan data are to be read from right to left as this denotes the order in which the data are scanned in the semiconductor chip. Preceding each scan data 66, 68 and 70 there is a control bit in the state of the logical "zero". Said logical "zero" characterizes, that the following scan data 66, 68 and 70 (right to left) corresponds with an activated power domain 10, 12 and 14, respectively. The logical "zero" is inserted by the power indicator 54.

The second bit-pattern 64 includes serially scan data of the first power domain 66 and scan data of the third power domain 70. The scan data 66 and 70 are preceded during the scan by a logical "zero", respectively. Between the logical "zero" corresponding to the first power domain 10 and the scan data 70 corresponding to the third power domain 14 there is inserted a logical "one". Said logical "one" indicates, that the corresponding power domain 12 is deactivated and bypassed. The logical "zeros" and the logical "one" are inserted by the power indicator 54.

Figure 5:
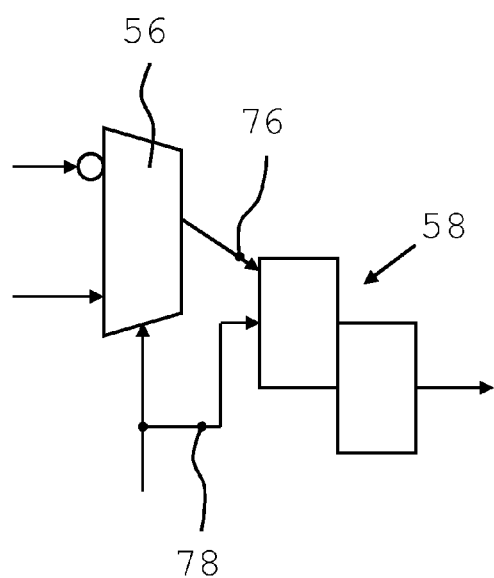
FIG. 5 illustrates a detailed diagram of a further embodiment of the power indicator in the semiconductor chip according to the second embodiment of the present invention.

In FIG. 5 a detailed diagram of a further embodiment of the power indicator 54 of FIG. 2 is shown. The power indicator 54 includes also the internal multiplexer 56 and the flip-flop element 58. The internal multiplexer 56 comprises the positive and the negated input and is a two-to-one multiplexer. It is scanned along a scan path 76. A functional input 78 of the flip-flop element 58 is loaded with the power state when it is not scanned. These guarantees, that the flip-flop element 58 always contains the current power state when the scan is started.

Figure 6:
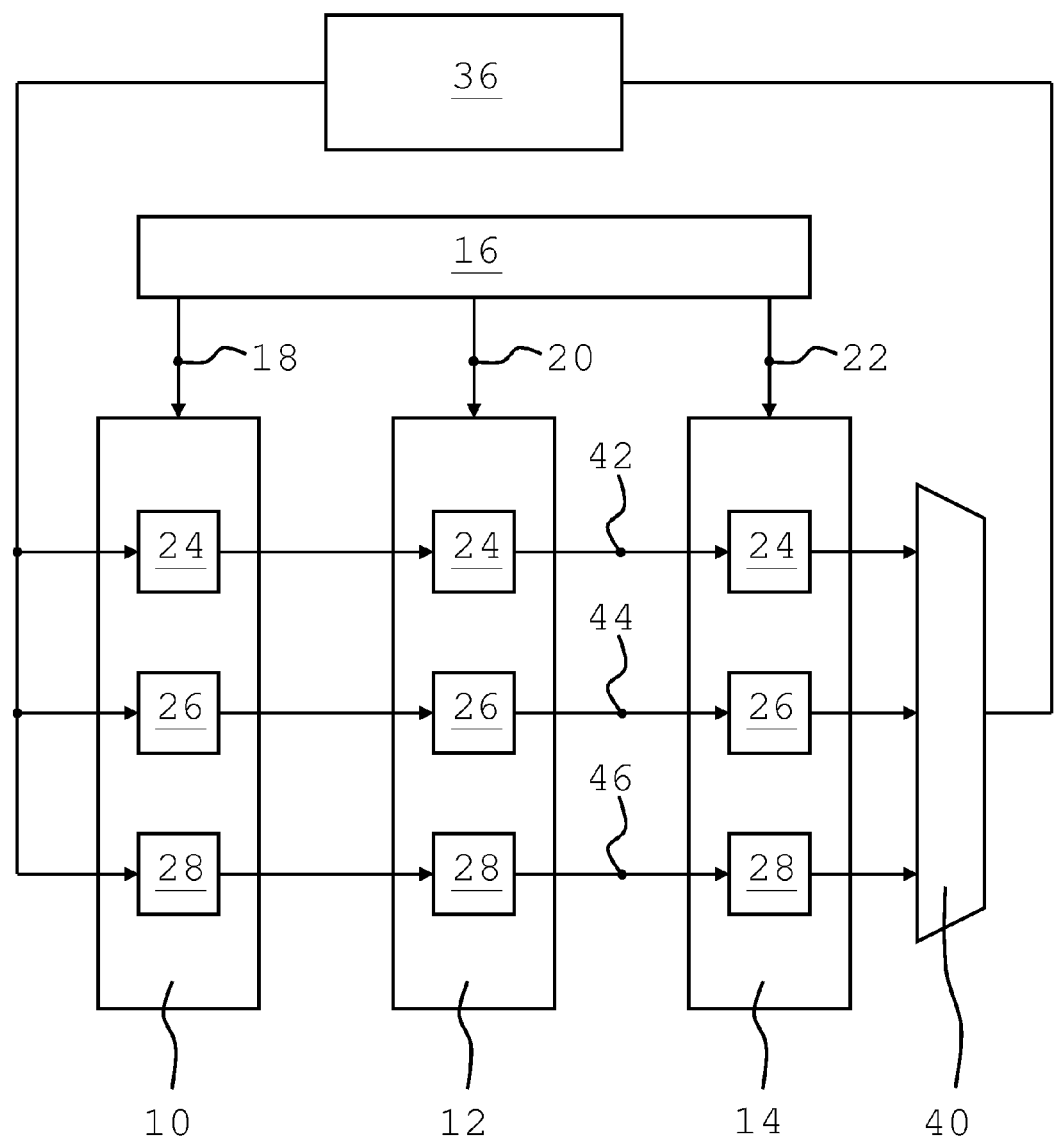
FIG. 6 illustrates a schematic diagram of an example of a semiconductor chip according to the prior art with activated power domains.

FIG. 6 illustrates a schematic diagram of an example of a semiconductor chip according to the prior art. Said semiconductor chip is subdivided into a plurality of power domains 10, 12 and 14. The power domains 10, 12 and 14 may be separately activated and deactivated by a power controller 16 via signal lines 18, 20 and 22. In FIG. 6 all power domains 10, 12 and 14 are activated. The power domains 10, 12 and 14 include a plurality of circuit units 24, 26 and 28. In FIG. 6 three circuit units 90 are shown in each power domain 10, 12 and 14. Each circuit unit 24, 26 and 28 comprises a plurality of electronic elements and in particular at least one scannable storage element.

Figure 7:
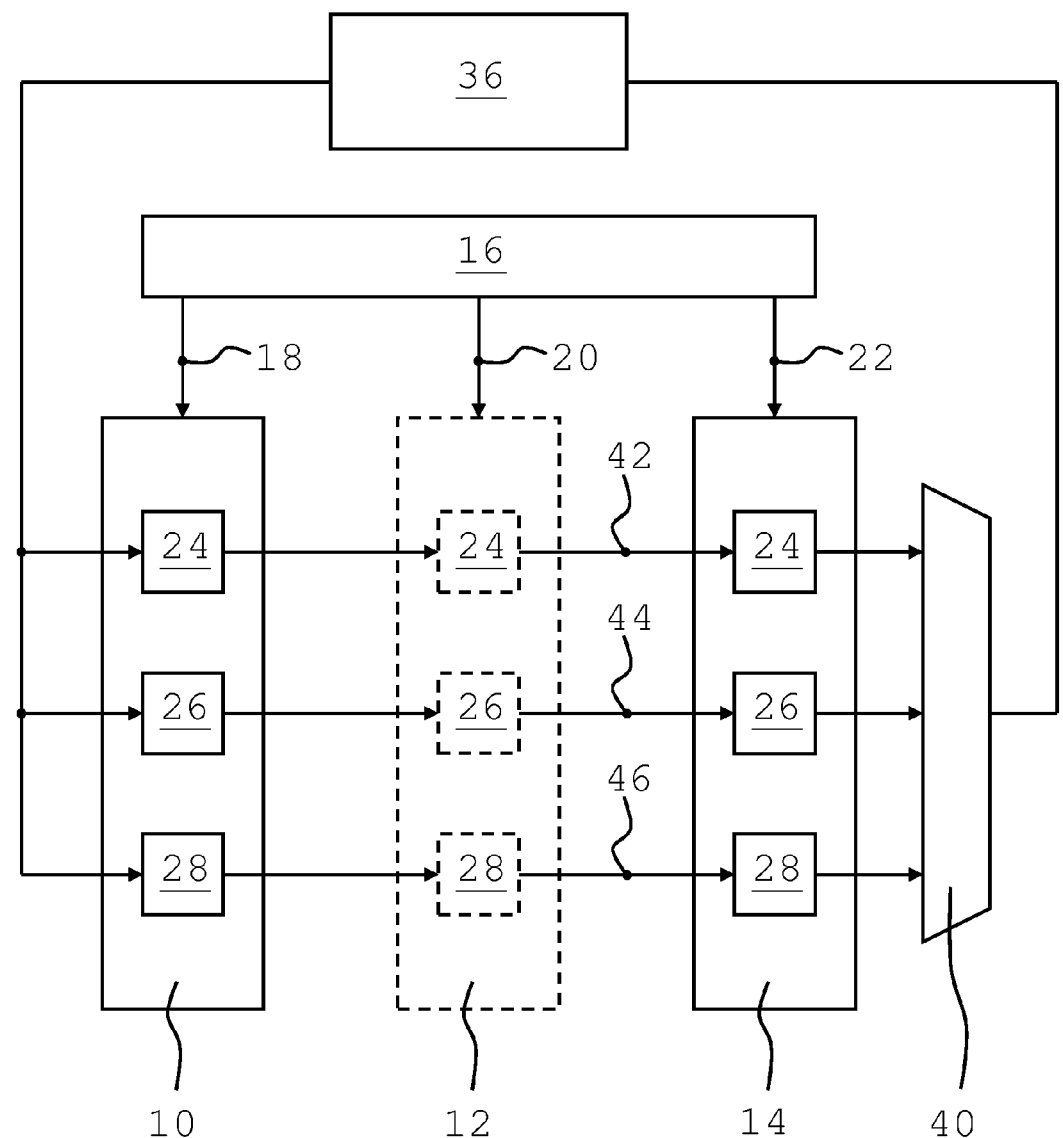
FIG. 7 illustrates a schematic diagram of the example of the semiconductor chip according to the prior art with a deactivated power domain.

FIG. 7 illustrates a schematic diagram that of the semiconductor chip according to the prior art of FIG. 6 in a state, wherein the second power domain 12 is deactivated. Therefore the scan chains 42, 44 and 46 are interrupted in the second power domain 12, since each of the scan chains 42, 44 and 46 crosses the deactivated power domain 12. In this second state it is not possible to propagate a scan test across a deactivated power domain. If only one of the power domains 10, 12 and 14 is deactivated, then it is not possible to scan the storage elements.

The semiconductor chip and the method according to the present invention overcome this problem of the prior art by scanning the storage elements. The method according to the present invention may be performed under normal operation conditions of the semiconductor chip. The method is provided for running a testcase on the semiconductor chip.

The present invention can also be embedded in a computer program product which comprises all the features enabling the implementation of the methods described herein. Further, when loaded in a computer system, said computer program product is able to carry out these methods.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit, comprising:
   a scan chain comprising pairs of circuit units and select units connected in series from a first circuit unit/select unit pair to a last circuit unit/select unit pair, each circuit unit of the pairs of circuit unit/select unit pairs containing a scannable storage element;
   an input of the scan chain directly connected to an input of a circuit unit of the first circuit unit/select unit pair;

an input of each circuit unit of each circuit unit/select unit pair of the circuit unit/select unit pairs connected to a first input of a corresponding select unit of the circuit unit/select unit pair by a respective bypass wire;

an output of each circuit unit of each circuit unit/select unit pair of the circuit unit/select unit pairs directly connected to a second input of the corresponding select unit of the circuit unit/select unit pair;

outputs of first to next to last select units of respective first to next to last select units of the circuit unit/select unit pairs directly connected to inputs of subsequent circuit units of the of the circuit unit/select unit pairs;

an output of the scan chain directly connected to an output of a last circuit unit of the last circuit unit/select unit pair;

each circuit unit of the first to last circuit unit/select units pairs contained within and powered by a respective power domain; and each select unit configured to select its first input when the power domain containing its corresponding is circuit unit is deactivated and to select its second input when the power domain containing its corresponding is circuit unit is activated.

2. The integrated circuit according to claim 1, wherein each select unit of the circuit element/select unit pairs is arranged on such contained and powered by a power domain of the which is permanently activated.

3. The integrated circuit according to claim 1, wherein each of the respective power domains is independently activated or deactivated by a power controller.

4. The integrated circuit according to claim 3, wherein the select units are multiplexers and select inputs of the multiplexers are controlled by the power controller.

5. The integrated circuit according to claim 3, wherein the select units are power indicators and select inputs of the power indicators are controlled by the power controller.

6. The integrated circuit according to claim 3, wherein the select units are multiplexers and select inputs of the multiplexers are responsive to the activated/deactivated state of the power domain containing its corresponding circuit unit.

7. The integrated circuit according to claim 3, wherein the select units are power indicators and select inputs of the power indicators are responsive to the activated/deactivated state of the power domain containing its corresponding circuit unit.

8. The integrated circuit according to claim 1, further including:
a scan engine configured to send scan data to the scan chain and to receive scan data from the scan chain, and output of the scan engine connected to the input of the scan chain and an input of the scan engine connected to the output of the scan chain.

9. The integrated circuit according to claim 8, wherein the power indicator includes at least a multiplexer and a flip-flop element.

10. The integrated circuit according to claim 9, wherein power indicator includes a XOR gate.

11. The integrated circuit according to claim 1, wherein the select units are power indicators.

12. The integrated circuit according to claim 11, wherein the select unit is a power indicator configured to insert additional bits into the scan chain.

13. The integrated circuit according to claim 12, wherein the additional bits indicate activated or deactivated states of the power domains.

14. The integrated circuit according to claim 1, wherein the select units are multiplexers.

15. A method for scanning storage elements of a integrated circuit instantiated across a plurality of discretely operable power domains, comprising;
providing a scan chain, said scan chain comprising:
a scan chain comprising pairs of circuit units and select units connected in series from a first circuit unit/select unit pair to a last circuit unit/select unit pair, each circuit unit of the pairs of circuit unit/select unit pairs containing a scannable storage element;
an input of the scan chain directly connected to an input of a circuit unit of the first circuit unit/select unit pair;
an input of each circuit unit of each circuit unit/select unit pair of the circuit unit/select unit pairs connected to a first input of a corresponding select unit of the circuit unit/select unit pair by a respective bypass wire;
an output of each circuit unit of each circuit unit/select unit pair of the circuit unit/select unit pairs directly connected to a second input of the corresponding select unit of the circuit unit/select unit pair;
outputs of first to next to last select units of respective first to next to last select units of the circuit unit/select unit pairs directly connected to inputs of subsequent circuit units of the of the circuit unit/select unit pairs;
an output of the scan chain directly connected to an output of a last circuit unit of the last circuit unit/select unit pair;
each circuit unit of the first to last circuit unit/select units pairs contained within and powered by a respective power domain; and
each select unit configured to select its first input when the power domain containing its corresponding is circuit unit is deactivated and to select its second input when the power domain containing its corresponding is circuit unit is activated;
selecting first inputs of said select units if power domains containing corresponding circuit units are deactivated;
selecting second inputs of said select units if power domains containing corresponding circuit units are activated; and
scanning test data into said scan chain and scanning resultant data out of said scan chain.

16. The method according to claim 15, further including:
a power controller independently activating and deactivating the power domains.

17. The method according to claim 16, further including:
inserting additional data bits into scan data, said additional data bits indicating the activation or deactivation states of each power domain.

18. The method according to claim 15, wherein the method is performed under normal operating conditions of the integrated circuit.

19. The method according to claim 15, wherein the method is performed during testing of the intergrated circuit.

20. The method according to claim 19, wherein a system implementing the method is realized in hardware, software or a combination of hardware and software.

* * * * *